United States Patent

Camiade et al.

[11] Patent Number: 5,103,189
[45] Date of Patent: Apr. 7, 1992

[54] HIGH-EFFICIENCY AMPLIFIER

[75] Inventors: Marc Camiade, Bagneux; Michel Gayral, Limoges, both of France

[73] Assignee: Thomson Composants Microondes, Puteaux, France

[21] Appl. No.: 560,787

[22] Filed: Jul. 31, 1990

[30] Foreign Application Priority Data

Aug. 18, 1989 [FR] France ............... 89 11025

[51] Int. Cl.⁵ .............................. H03F 1/34
[52] U.S. Cl. ..................... 330/277; 330/294; 330/296
[58] Field of Search ........... 330/277, 296, 294

[56] References Cited

U.S. PATENT DOCUMENTS 4,467,288  8/1984  Strickland .................. 330/149

FOREIGN PATENT DOCUMENTS 0033198  8/1981  European Pat. Off. .
142609   8/1983  Japan ...................... 330/277
13107    1/1987  Japan ...................... 330/296

Primary Examiner—James B. Mullins
Attorney, Agent, or Firm—Oblon, Spivak, McClelland, Maier & Neustadt

[57] ABSTRACT

The disclosure concerns a microwave amplifier. To improve the efficiency of an amplifier having a field-effect transistor, an input quadripole and an output quadripole, the voltage applied to the gate is limited to a deviation between the pinch-off voltage $V_P$ and the positive maximum gate voltage $V_{GS}$, using a diode of a second order harmonic reverse feedback circuit. Application to microwave circuits.

1 Claim, 2 Drawing Sheets

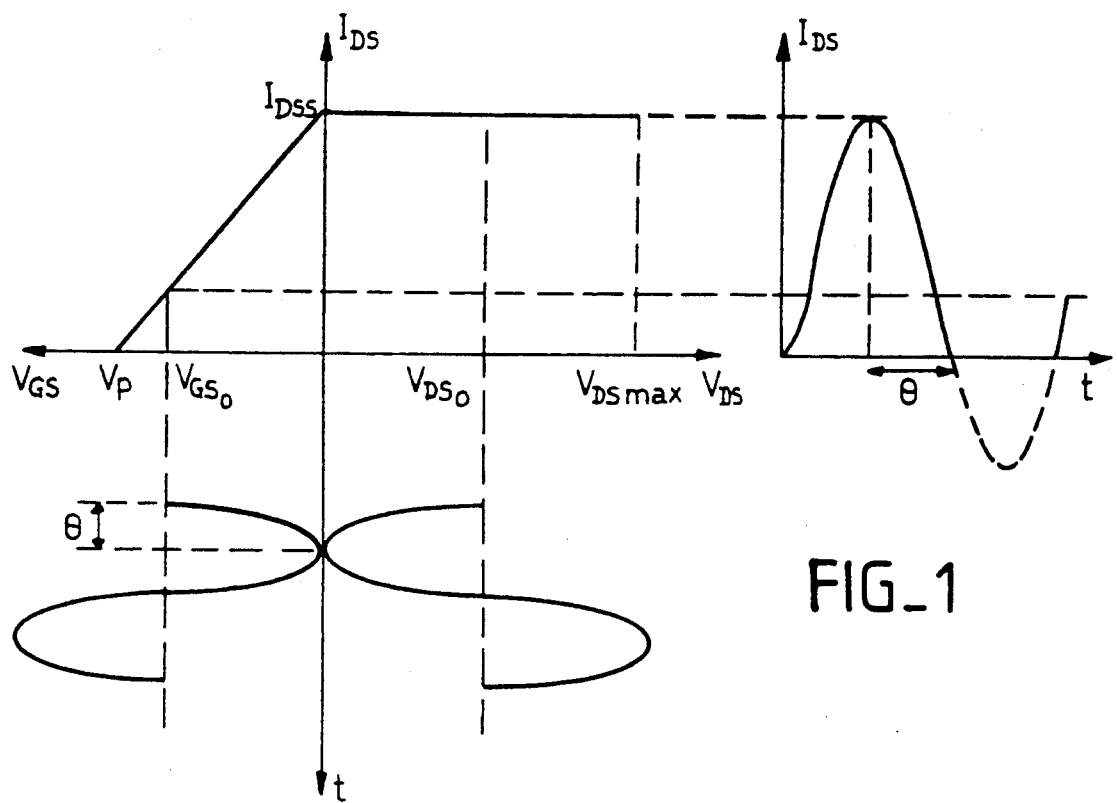
FIG_1
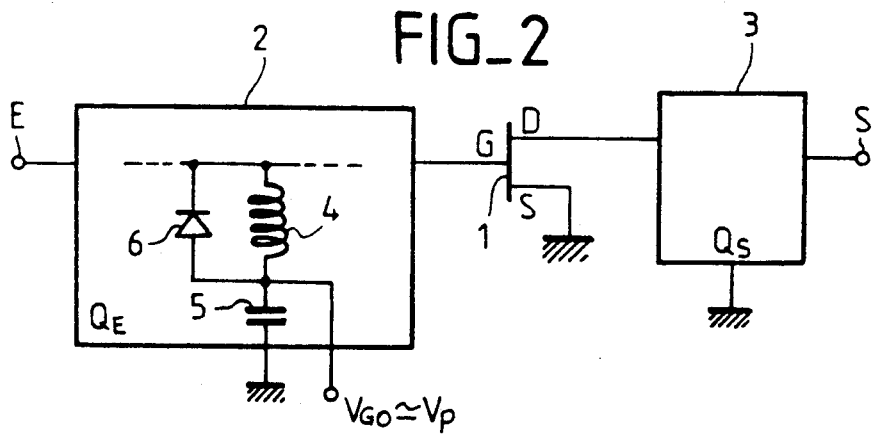
FIG_2
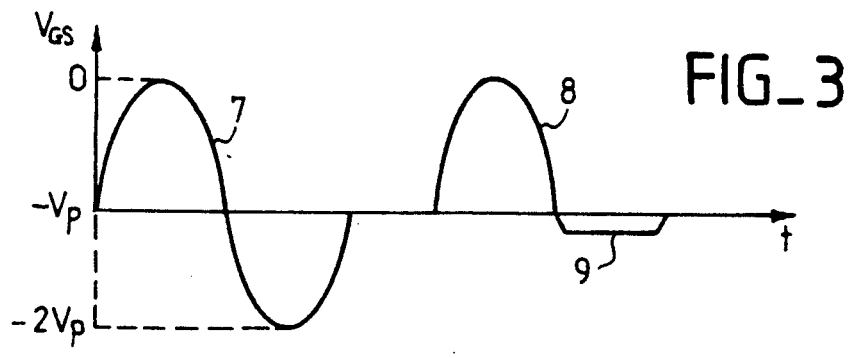
FIG_3

FIG_4
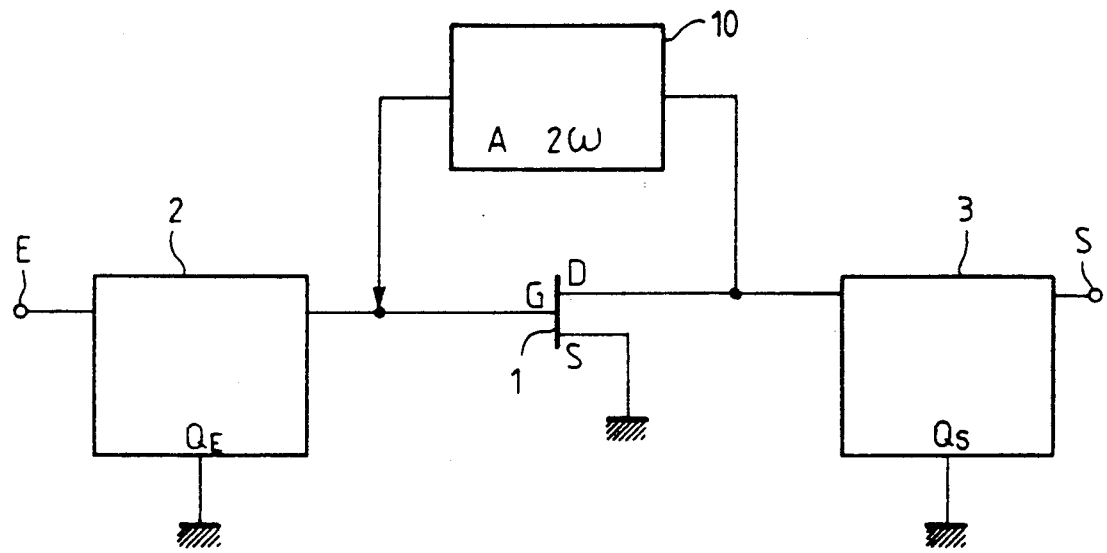
FIG_5
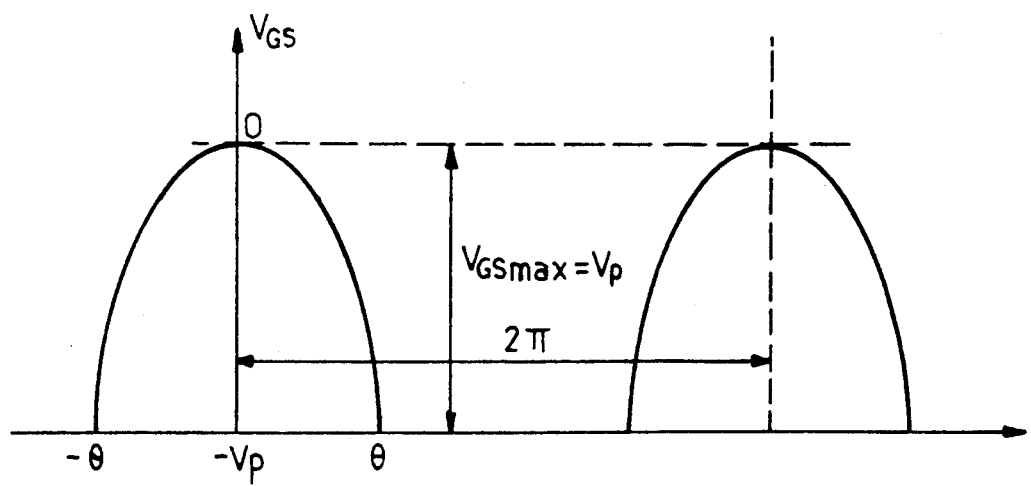

HIGH-EFFICIENCY AMPLIFIER

BACKGROUND OF THE INVENTION

1. Field of the Invention

The present invention concerns the structure of an amplifier and, notably, that of a microwave amplifier. It constitutes an improvement designed to increase the electrical efficiency of the amplifier.

It is becoming indispensable to increase the electrical efficiency of field-effect transistors for present as well as future electronic systems, because of the increase in the number of circuits. To obtain this improvement in performance characteristics, it is necessary to:

improve the technology for making the transistors;
reduce the losses of the passive matching circuits.

The invention concerns the latter point.

2. Description of the Prior Art

It is known that the characteristics of a transistor biased below its pinch-off voltage are not reproducible. They depend on the technology used to make the component, and no manufacturer guarantees these characteristics.

But it is also known that if a voltage, far greater in terms of absolute value, is applied to the gate of a field-effect transistor, this transistor is subjected to a sort of hysteresis: when the gate voltage returns to a value between the pinch-off voltage and the maximum gate voltage, the transistor does not respond immediately. It stays off for a certain time, during which the input signal is not amplified. This corresponds therefore to a diminishing of efficiency and to an unnecessary dissipation of energy.

SUMMARY OF THE INVENTION

It is an object of the invention, therefore, to introduce means into the structure of an amplifier where said means limit the voltage applied to the gate to values between the pinch-off voltage and the maximum gate voltage, so that the transistor works permanently according to perfectly controlled characteristics. This limiting of the voltage applied to the gate can be obtained in different ways, using a diode that constitutes a short-circuit for the negative stage of the signal, or by means of a second order harmonic reverse feedback circuit.

More precisely, the invention concerns a high-efficiency amplifier including at least one field-effect transistor, one input signal matching input quadripole, connected to the gate of the transistor, and one output quadripole connected to the drain of the transistor, the source of which is grounded, said amplifier including means for limiting the deviation of the voltage applied to the gate to values between the pinch-off voltage $V_P$ of the transistor and the maximum positive gate voltage $V_{GSmax}$.

BRIEF DESCRIPTION OF THE DRAWINGS

The invention will be understood more clearly from the following description of two exemplary embodiments, which are explained with reference to the appended drawings, of which:

FIG. 1 shows static characteristic curves of a field-effect transistor, according to the prior art;

FIG. 2 is a block diagram of an amplifier provided with a first means for improving the efficiency according to the invention;

FIG. 3 shows curves of the voltage applied to the gate, in the case of the assembly of the previous figure;

FIG. 4 shows a block diagram of an amplifier provided with a second means for improving the efficiency, according to the invention;

FIG. 5 shows the form of the voltage applied to the gate, in the case of the assembly of the previous figure.

DESCRIPTION OF PREFERRED EMBODIMENTS

FIG. 1 represents the simplified static characteristic curves of a transistor. It gives the temporal behavior of the voltages and currents when a voltage $$V_{GS} = V_{GS0} + V_{GS1} = \cos \omega t$$

is applied between the gate and the source. The following are represented in this figure:

$I_{DS}$ = drain-source current
$V_{DS}$ = drain-source voltage
$V_{GS0}$ = gate bias DC voltage
$V_{DS0}$ = drain bias DC voltage
$V_P$ = pinch-off voltage
$t$ = time.

$\theta$ represents the angle of flow or of conduction of the transistor, for an AC signal applied to the gate. It corresponds to the time interval during which the drain current $I_{DS}$ is not zero (to the right in the figure).

The electrical efficiency of a transistor may be expressed in two ways.

The drain efficiency $\eta_D$ is equal to the ratio of the output power at the operating frequency to the power injected by the DC generators:

$$\eta_D = \frac{P_S(\omega)}{P_{DC}}$$

This efficiency is all the greater as the angle of flow is small.

The added power efficiency $\eta_{aj}$ is derived therefrom by taking into account the power injected at the input of the transistor at the frequency:

$$\eta_{aj} = \frac{P_S(\omega) - P_E(\omega)}{P_{DC}}$$

$\eta_{aj}$ is a function of the gain G of the transistor:

$$\eta_{aj} = \eta_D \left(1 - \frac{1}{G}\right)$$

The aim is to increase the added power efficiency $\eta_{aj}$, but this optimization comes up against three limitations.

The first limitation concerns the dependence of the efficiency on the gain. For the drain efficiency $\eta_D$ to increase and, hence, for the angle of flow to decrease, it is necessary to apply a higher voltage, hence a higher input power $P_E(\omega)$, which diminishes $\eta_{aj}$, to the gate of the transistor. There is therefore an optimum angle of flow $\theta$ for a transistor.

The second limitation arises out of the operation of the transistor below its pinch-off voltage. In effect, as stated previously, the characteristics of a transistor in this zone of operation are not guaranteed by any manufacturer. They depend on the technology by which the transistor is manufactured and are not reproducible.

Furthermore, if the input signal applied to the gate is far below the pinch-off voltage, for example $-2V_P$ or $-3V_P$, the transistor does not resume normal operation once the signal becomes higher than $V_P$. There is a certain lapse of time during which the transistor does not work, and this lowers the efficiency.

The third limitation also concerns operation below the pinch-off voltage $V_P$ and is related to the output power level. If we consider, in FIG. 1, the variations of $V_{GS}$ and $V_{DS}$ as a function of the time t, they are in phase opposition. For a maximum level of output power, if the absolute power of $V_{GS}$ increases, the deviation $V_{GD}$ (gate-drain voltage) increases, but it is limited by an avalanche phenomenon. We therefore have:

$$V_{GDmax} = |V_{GS}| + |V_{DS}| = \text{cste}$$

If $|V_{GS}|$ increases, to reduce the angle of flow and improve the efficiency, $|V_{DS}|$ must diminish: in this case, the output power diminishes. The invention proposes two means to avoid these three limitations. The first means is shown in FIG. 2.

An amplifier may be considered to be essentially a field-effect transistor 1. It forms part of a circuit, which may be likened to a quadripole 2 connected to its gate and to a quadripole 3 connected to its drain, if the transistor is mounted as a common source.

The microwave input signal is applied to the input E of this quadripole, but a DC bias voltage $V_{Go}$, close to the pinch-off voltage $V_P$, is also applied to the gate of the transistor 1. Generally, a network formed by a self-inductor 4 and a capacitance 5 acts as a microwave filter, so as not to disturb the DC supply.

The invention consists in carrying out an insertion, in the input matching network of the transistor 1, of a diode 6 mounted in the direction that goes from the ground towards the input terminal. This diode short-circuits any input signal when the voltage that it generates at the terminals of the gate becomes smaller than the pinch-off voltage $V_P$. In other words, the input network of the transistor 1 does not change during the positive alternation of the gate voltage, but becomes a short-circuit during the negative alternation.

This is what is shown in FIG. 3. For a voltage $V_{GS}(t)$ that varies, for example, between 0 and $-2V_P$, the curve 7, without the diode 6, is a sinusoid that has a negative part. With a diode 6, all that remains is the positive part 8 of the voltage applied to the gate. Only a fraction 9 of this voltage is a little smaller than $V_P$: this corresponds to the forward threshold voltage of the diode 6.

The passive elements of the input quadripole $Q_E$ are computed so that the harmonics generated by the diode get added up at the gate of the transistor with the right phases and amplitudes of the signal.

The advantage of the diode is that the power to be injected into the transistor is limited to the positive region of the input signal. It is twice as small with a diode as it is without a diode. Since the transistor is not used below its pinch-off voltage $V_P$, its behavior is well known, and since the amplitude of the voltage $V_{GS}$ is the same as in a class A amplifier, the maximum output power can be achieved.

The second means is shown in FIG. 4, which gives the simplified diagram of an amplifier formed by a transistor 1, with an input quadripole 2 at its gate and an output quadripole 3 at its drain. To improve its efficiency, a second order harmonic reverse feedback loop 10 is mounted between the output and the input of the transistor. This loop picks up the naturally produced second order harmonic at the drain of the transistor and reinjects it into the gate. This reverse feedback loop is known per se and is formed by resistors, self-inductors and capacitors.

The voltage which it is sought to apply to the gate of the transistor has the following form, in Fourier series, shown in FIG. 5:

$$V_{GS}(t) = V_P[f_0(\theta) + f_1(\theta)\cos \omega t + f_2(\theta)\cos 2\omega t + \ldots]$$

wherein
$f_0(\theta)V_P$ is the amplitude of the gate bias DC voltage,
$f_1(\theta)V_P$ is the amplitude of the voltage at the frequency $\omega$ generated by the power to be injected into the gate,
$f_1(\theta)V_P$ is the amplitude of the voltage at the frequency $2\omega$.

The output current $I_{DS}$ of the transistor is not sinusoidal. It always generates harmonics. It is useful to recover this energy at the harmonic frequency $2\omega$, and to reinject it into the input of the transistor.

The deviation of the voltage $V_{GS}$ is limited, in the same way as with a diode at the input but, in addition, the second order harmonic reverse feedback circuit increases the added power efficiency $\eta_{aj}$ since a part of the output power, which is without reverse feedback, is recovered.

Both means of increasing the efficiency of an amplifier may be used simultaneously.

What is claimed is:

1. A high efficiency amplifier including at least one field-effect transistor, one input signal matching input quadripole, connected to the gate of the transistor, and one output quadripole connected to the drain of the transistor, the source of which is grounded, said amplifier including means for limiting the deviation of the voltage applied to the gate to values between the pinch-off voltage $V_P$ of the transistor and the maximum positive gate voltage $V_{GSmax}$ wherein the means for limiting the voltage applied to the gate is a second order harmonic reverse feedback circuit which picks up said second order harmonic at the output quadripole and reinjects it into the input quadripole.

* * * * *